United States Patent [19]

Char et al.

[11] Patent Number: 5,157,466
[45] Date of Patent: Oct. 20, 1992

[54] GRAIN BOUNDARY JUNCTIONS IN HIGH TEMPERATURE SUPERCONDUCTOR FILMS

[75] Inventors: Kookrin Char; Stephen M. Garrison, both of Palo Alto; Nathan Newman, Montara; Gregory G. Zaharchuk, Palo Alto, all of Calif.

[73] Assignee: Conductus, Inc., Sunnyvale, Calif.

[21] Appl. No.: 672,664

[22] Filed: Mar. 19, 1991

[51] Int. Cl.$^5$ ............... H01L 39/22; H01B 12/00; B05D 5/12
[52] U.S. Cl. ............... 357/5; 505/1; 505/702; 427/62
[58] Field of Search ............... 357/5; 427/62, 63; 505/1, 702, 832, 874, 845

[56] References Cited

FOREIGN PATENT DOCUMENTS

| | | | |
|---|---|---|---|
| 325765 | 8/1989 | European Pat. Off. | 357/5 |
| 364101 | 4/1990 | European Pat. Off. | 357/5 |
| 62-273782 | 11/1987 | Japan | 357/5 |
| 1-120878 | 5/1989 | Japan | 357/5 |
| 1211983 | 8/1989 | Japan | 357/5 |
| 2184087 | 7/1990 | Japan | 357/5 |

OTHER PUBLICATIONS

"High $T_c$ Yb-Ba-Cu-O Thin Films Deposited on Sintered YSZ Substrates by Sputtering", Kawasaki et al., Japanese Journal of Applied Physics, vol. 26, #5, May 1987, pp. L738-L740.

Aida et al., "Preparation of $YBa_2Cu_3O_{7-x}$ Superconducting Thin Films by RF-Magnetron Sputtering", Jap. J. of Appl. Phys., vol. 26, #9, Sep. 1987, pp. L1489-L1491.

Hashimoto et al., "Thermal Expansion Coefficients of High-$T_c$ Superconductors", Jap. J. of Appl. Phys., vol. 27, #2, Feb. 1988, pp. L214-L216.

Ramesh et al., "Epitaxy of Y-Ba-Cu-O Thin Films Grown on Single-Crystal MgO", Appl. Phys. Lett., vol. 56, #22, 28 May 1990, pp. 2243-2245.

Primary Examiner—Rolf Hille
Assistant Examiner—Mahshid Saadat
Attorney, Agent, or Firm—Marvin E. Jacobs

[57] ABSTRACT

Grain boundary, weak-link junctions are formed at a predermined location of a uniform, planar substrate by depositing superconducting film on two sections of the substrate. The film is grown as a bicrystal having two distinct areas of superconducting film whose crystal lattices are rotated with respect to each other, either in-plane or out-of-plane, by more than 5° and less than 90°. The grain boundary acts as a weak link junction. The film can be induced to grow as a bicrystal by depositing intermediate strata such as seed layers or buffer layers or by modifying the growth conditions during deposition.

39 Claims, 12 Drawing Sheets

GRAIN BOUNDARY JUNCTIONS IN HIGH TEMPERATURE SUPERCONDUCTOR FILMS

DESCRIPTION

1. Technical Field

The present invention relates to grain boundary weak-link junctions of high-temperature superconductors and methods of fabricating them.

2. Background of the Invention

Devices made from high-temperature superconductors (HTS) operate at or near the boiling point (77K) of liquid nitrogen, a cheap coolant that is widely available and easy to store, handle, and transport. Superconducting quantum interference devices (SQUIDs) operating near 77K are desirable for a number of applications including non-destructive testing, geophysical surveys, medical imaging, and earthquake detection.

HTS materials are based on anisotropic layered crystalline structures. Colloquially speaking, each unit cell of HTS material has approximately the shape of a shoebox, a rectangular solid in which the three dimensions (a, b, and c) are different--a and b have similar values, and c is approximately three times greater. The superconducting properties in the a and b dimensions are similar, but the superconducting properties in the c dimension are dramatically worse. For reference, if the box is sitting on its end on a table, the so-called "a-b plane" is parallel to the table, and the "c-axis" is perpendicular to the table. The a-b plane contains parallel sheets of copper and oxygen which have excellent superconducting properties. Along the c axis, perpendicular to the planes, the superconducting properties are poor.

In bulk polycrystalline samples of HTS materials, the critical current density (a measure of how much electrical current a superconductor can carry) is low, for two reasons. First, the grains of material are randomly oriented. As a result, in some grains, the current will flow along the dimension where superconducting properties are excellent, but in others, it must flow along the dimensions where superconducting properties are poor. Second, where "high-angle grain boundaries" exist that is, where the adjacent grains are misoriented by more than 5° and less than 90°—the grain boundaries behave as "weak links", which have degraded superconducting properties.

It is possible to grow thin films of high temperature superconductors which contain no weak links. These films grow in a highly oriented manner, usually with the c axis perpendicular to the substrate and the copper-oxygen sheets parallel to the substrate. Such films are not truly single crystals—virtually all high-quality thin films contain many low-angle grain boundaries and twin boundaries. Fortunately, low-angle grain boundaries (where adjacent grains are misoriented by less than approximately 5°) and twin boundaries (at which the grains are misoriented by approximately 90°) do not degrade superconducting electrical transport properties. Therefore, highly-oriented films which contain no grain boundaries greater than approximately 5° or less than approximately 90° truly have no weak links, and they offer performance equivalent to a single crystal. Such thin films offer the potential for high-performance devices.

Weak-Link Junctions

In the context of the previous discussion of bulk material and high-quality thin films, "weak links" were undesirable randomly occurring, uncontrolled areas of degraded superconductivity. However, many HTS circuit applications actually require weak links of one type or another. A "weak link junction" is one type of Josephson junction, which is broadly defined as two weakly coupled superconductors. In this paper, we define a weak-link junction as two regions of superconducting film with a given critical current density separated by material in which the critical current density is lower by at least a factor of 10.

Weak-link junctions make it possible to create extremely sensitive instruments to measure magnetic field, voltage, and current. The ability to create weak-link junctions in specific places in a controlled manner is an essential aspect of HTS circuit technology. For some circuit applications, it is desirable to fabricate multiple weak-link junctions in an array.

Grain-Boundary Weak-Link Junctions

As mentioned above, high-angle grain boundaries distributed randomly within c-axis oriented $YBa_2Cu_3O_7$ (YBCO) thin films will degrade the supercurrent transport properties of the films. However, the low critical current density of these grain boundaries suggests that they could serve as weak-link junctions. The I-V characteristics of grain boundary weak links are very desirable for device purposes (they can be modeled by a resistively shunted Josephson junction), and their characteristic voltages (as determined by the product of their critical currents and normal-state resistance, or "$I_cR$ products") are satisfactory for use in SQUID devices.

There is a diversity of prior art with respect to grain boundary weak-link junctions. In one technique, a single-crystal substrate, lattice-matched to HTS materials is cut and rebonded to achieve an in-plane angle of more the 5° between its crystal orientations. When an HTS film is grown on this bicrystal, the grain boundary of the substrate is replicated in the film. High-quality junctions and high-$T_c$ SQUIDs operating up to 87K with low noise have been fabricated by this technique. But the technique has three main drawbacks. First, fabrication of a bicrystal substrate is a complex and difficult procedure. Second, weak link junctions can be located only along the rebonded line. Third, fabrication of large arrays of junctions and SQUIDs is very difficult with this technique.

A second technique relies on polycrystalline, granular films which do contain randomly distributed high-angle grain boundaries. Several groups have fabricated SQUIDs by patterning the device structure and hoping that weak link grain boundaries will chance to occur in the correct locations. However, imprecise control of the placement of the grain boundaries has resulted in poor yields. Furthermore, these polycrystalline, granular films have overall low superconducting transport properties as a result of the high-angle grain boundaries that occur throughout the film. In addition, electrical noise due to flux motion in the randomly located weak links is typically found.

A third technique relies on sharp steps cut into a single crystal substrate. Each of these steps propagates two grain boundaries (at the base and at the top of the step) in a superconducting thin film which grows above it. This technique requires very precise control of several geometric variables and processing steps. In order to gain control of the fabrication process, it is necessary to control precisely the size and slope of the steps, which, on a wafer scale, is a difficult challenge. The inherently non-planar nature of the structure creates additional topological and processing problems for making multilayer circuits. It is difficult, using this technique, to fabricate weak links which have desirable electrical characteristics at or above the temperature of liquid nitrogen.

In the prior art, there is no way to fabricate an HTS multilayer thin film integrated circuit containing a multiplicity of grain boundary weak-link junctions that have similar and highly reproducible I-V characteristics at arbitrarily specified locations, while maintaining a high superconducting transition temperature and high critical current density (i.e., above $1 \times 10^6$ amperes/cm$^2$ at 4.2K) in the superconducting films.

SUMMARY OF THE INVENTION

This invention describes a novel and useful method of depositing superconducting film on two sections of a uniform planar substrate to produce a grain boundary weak-link junction at a predetermined location. (By uniform planar substrate, we mean a substrate that has not been cut and rebonded, whose surface morphology or crystal structure will not propagate grain boundaries into the material deposited onto it. In most cases, the substrate will be a single crystal, but it could be polycrystalline or even amorphous.)

Our novel methods make it possible to form arrays of junctions at specified locations without degrading the properties of the superconducting material in any location other than at the grain boundary weak links. The invention also describes many useful high-temperature superconductor device structures which embody these methods.

This document describes ways of growing a superconducting film as a bicrystal--two distinct areas of superconducting film whose crystal lattices are rotated with respect to each other, either in-plane or out-of-plane, by more than 5° and less than 90°. Since the grain boundary between these two areas has a critical current density at least 10 times lower than the adjacent superconducting film, it displays all the electrical characteristics desirable in a weak-link junction.

One method of inducing the superconducting film to grow as a bicrystal is to deposit intermediate strata of material which cover all or part of the substrate. There are two types of intermediate strata: seed layers and buffer layers. Intermediate layers are usually non-superconducting, but they can be superconducting.

A seed layer serves as a template to determine the crystalline orientation of the layer which overlies it. It can be very thin, even less than one monolayer in thickness. In some cases, for example where a seed layer covers only part of the substrate, it may be desirable to slope the seed layer so it has an angle of less the 45°, even less than 10°, with the surface of the substrate.

A buffer layer has four possible functions: to prevent chemical interactions between the layers above and below, to protect a lower layer from processing steps, to provide an intermediate lattice match between the layers above and below, or to provide a cleaner grain boundary.

It is possible to control the crystal orientations of seed layers, buffer layers, and superconducting films by modifying the growth conditions during deposition$_{13}$for example, the substrate temperature, the oxygen partial pressure in the deposition chamber, the total gas pressure in the deposition chamber, the film composition, and the density of the plasma at the substrate. Ways of modifying these variables to control the orientation of oxide superconductors are known to people skilled in the art of superconducting thin film deposition.

Another method of controlling the crystal orientations of seed layers, buffer layers, and superconducting films is to modify the surface of an underlying region— for example, by physically abrading the surface, by chemically etching or treating it, by changing its chemical composition, or by graphoepitaxy.

To cause an in-plane or out-of-plane rotation to occur, sometime a seed layer or substrate that has a poor lattice-match (greater than about 5%) is used. The lattice constants of materials commonly used as substrates for growing high-temperature superconductors such as YBCO are as follows:

| Material | Orientation | Lattice Constant (Angstroms) |
| --- | --- | --- |
| YBCO | 100 | 3.86 |
| SrTiO$_3$ | 100 | 3.91 |
| CaTiO$_3$ | 100 | 3.82 |
| MgO | 100 | 4.21 |
| LaAlO$_3$ | 100 | 3.79 |
| Al$_2$O$_3$ | r-plane | 3.48 |
| YSZ | 100 | 5.14 |

By combining the techniques mentioned above in various ways, it is possible to produce grain boundary weak link junctions and arrays of such junctions in a predictable and controlled manner with high yield. The methods are viable for all mixed-metal cuprate and bismuthate superconductors with transition temperature higher than 15K. Various embodiments

DETAILED DESCRIPTION OF THE DRAWINGS

Figure 1:
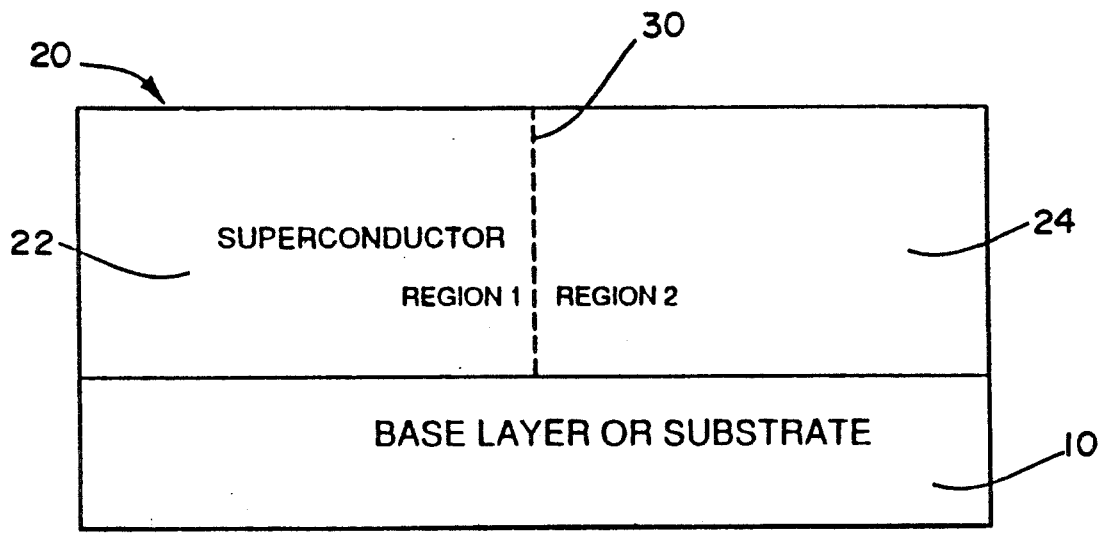
FIG. 1 is a schematic side-view representation of an in-plane weak link grain boundary junction.
Figure 2:
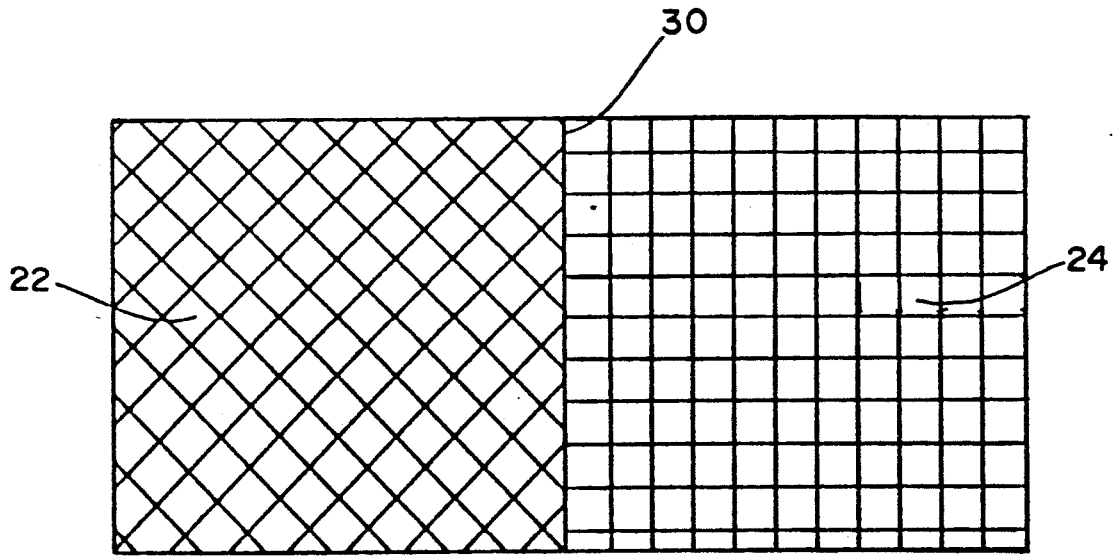
FIG. 2 is a schematic top-view representation of an inplane weak link grain boundary junction.

FIGS. 1 (cross-sectional view) and 2 (top view) illustrate a weak-link grain boundary junction. A uniform planar substrate (10) supports two regions of superconducting film (12 and 14). Both of these regions contain no high-angle grain boundaries and thus no weak links; they may be single crystals.

In one variation of this embodiment, the crystal lattice of the superconducting film in the first region (12) and the crystal lattice of the superconducting film in the second region (14) are rotated in-plane by more than 5° and less than 90° with respect to each other.

In a second variation of this embodiment, the crystal lattice of the superconducting film in the first region (12) and the crystal lattice of the superconducting film in the second region (14) are rotated out-of-plane by more than 5° and less than 90° with respect to each other.

In both of these variations, there is a grain boundary weak-link junction (16) in the superconducting film at the juncture between the first and second regions.

In the most general sense, the method of creating this structure consists of depositing superconducting film on two adjacent regions of a uniform planar substrate to produce a weak-link grain boundary junction at the juncture between the first region and the second region. More specifically, the method comprises growing the superconducting film in the first region (12) with a different crystal orientation compared to the superconducting film in the second region (14).

In elucidating the method, five more detailed issues must be specified:

(i) The method of limiting the superconducting film in the first region (12) so it covers only a portion of the substrate. This can be achieved by many processes standard in the semiconductor industry, such as masking the other portion of substrate, or covering the entire substrate and then removing the material where it is not wanted—the method chosen is arbitrary and does not constitute an important part of this invention.

(ii) The method of inducing the superconducting film to grow with one orientation in the first region (12) and a different orientation in the second region (14). One strategy is to control the different orientations by modifying the surface of the substrate. For example, the surface underlying the first region of superconducting material could be physically abraded, chemically etched, chemically treated, modified in chemical composition, or modified by graphoepitaxy. This strategy is not limited to the substrate; it can, in principle, be applied to any subsurface layer in a multilayer structure as a means of controlling the orientation of the layer which deposits onto it. (FIG. 1 can be understood as a structure in which the surface of the substrate underlying one or both region of superconducting film has been physically abraded, chemically etched, chemically treated, modified in chemical composition, and/or modified by graphoepitaxy.)

A second strategy is to deposit the superconducting film in the first region and the superconducting film in the second region under different growth conditions— for example, by modifying the substrate temperature, the density of plasma at the substrate, the total gas pressure in the chamber, or the oxygen partial pressure in the chamber. Methods of varying these deposition parameters to achieve different orientations of superconducting film are well known to people skilled in the art of HTS film deposition.

(iii) The nature of the deposition process. Any deposition process may be used, including sputtering, laser ablation, chemical vapor deposition, metalo-organic chemical vapor deposition, and liquid phase epitaxy.

(iv) The selection of the superconducting material. The superconducting film may be any oxide with a superconducting transition temperature higher than 15K. The HTS materials are mixed-metal cuprates or mixed-metal bismuthates which belong to one of four families: the rare earth cuprates, the thallium-based cuprates, the bismuth-based cuprates, and the alkaline earth bismuthates. The structures and techniques described in this disclosure can be implemented in all known oxide superconductors and any superconducting materials with similar properties which may be discovered in the future.

(v) The substrate material. There is no limitation to the material from which the substrate (10) may be chosen, as long as the material supports the growth of materials of suitable quality. The common substrates include those that have a close lattice match with the superconducting materials, such as $SrTiO_3$, $CaTiO_3$, and $LaAlO_3$, and those that do not have a close lattice match with the superconducting materials, such as $Al_2O_3$, MgO, and yttria-stabilize zirconia (YSZ).

Another method of growing the superconducting film in the first region with a different crystal orientation compared to the superconducting film in the second region is to grow one or more intermediate layers of material between the substrate and the superconducting film. The intermediate layers may be either seed layers or buffer layers.

A seed layer serves as a template to determine the crystalline orientation of the layer which overlies it. It can be very thin, even less than one monolayer in thickness. In some cases, for example where a seed layer covers only part of the substrate, it may be desirable to slope the seed layer so it has an angle of less than 45°, even less than 10°, with the surface of the substrate.

A buffer layer has four possible functions: to prevent chemical interactions between the layers above and below, to protect a lower layer from processing steps, to provide an intermediate lattice match between the layers above and below, or to provide a cleaner grain boundary.

The thickness of these intermediate layers may be arbitrarily small, even less than one atomic monolayer. (A layer whose thickness is "less than one monolayer" obviously can't contain fractions of atoms; it contains an average of less than one monolayer—i.e., subregions of one monolayer and subregions of no atoms at all.)

We will discuss eight different generic structures which employ intermediate layers, including several embodiments of each and the methods of making them.

Figure 3

The first generic method of growing the superconducting film in the first region with a different crystal orientation compared to the superconducting film in the second region consists of the following steps: growing one or more seed layers over a portion of the substrate extending over the first region, and growing a superconducting film over both the first region and the second region. This strategy yields the structure shown in FIG. 3.

Figure 3:
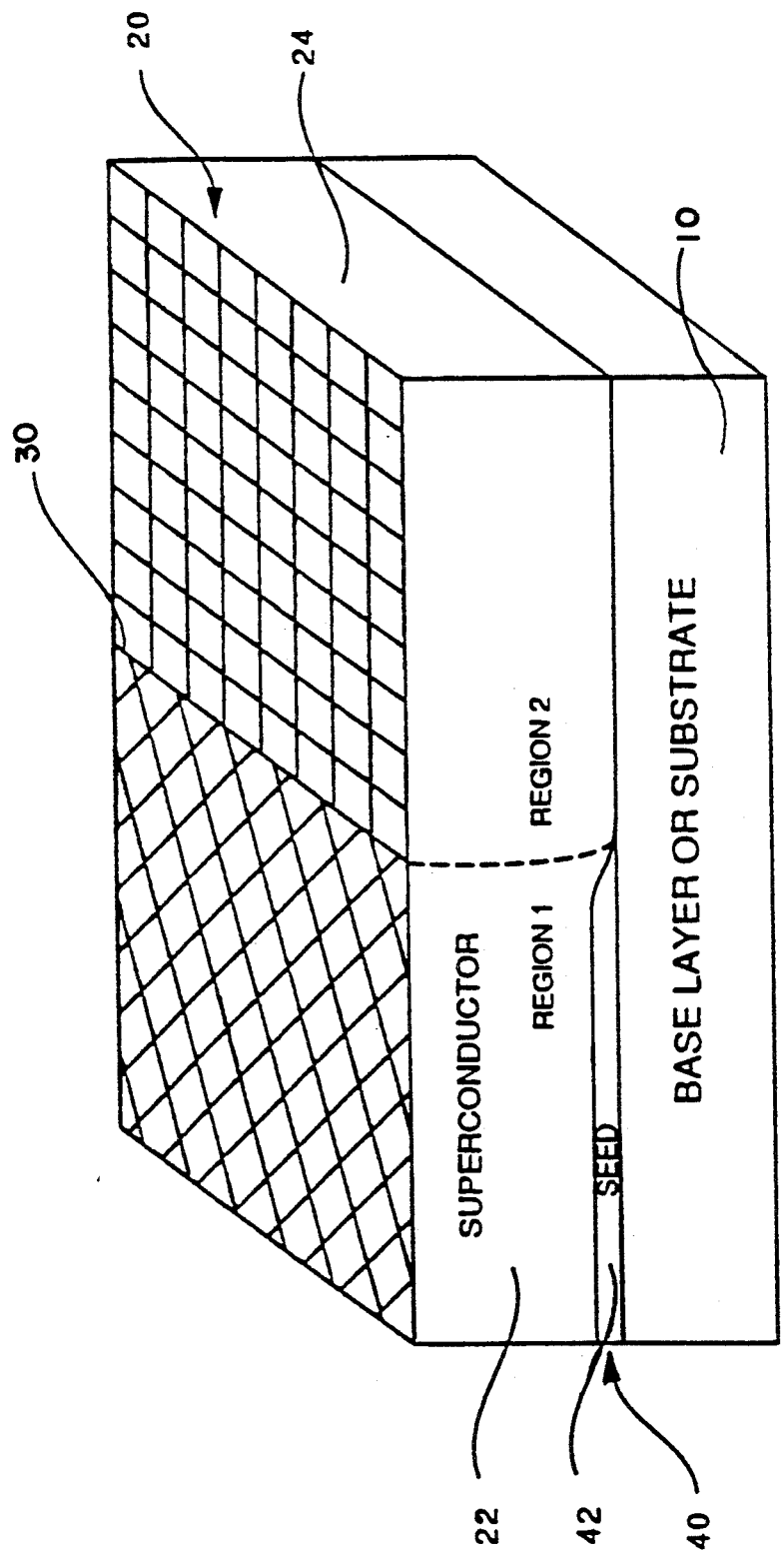
FIG. 3 is a schematic side-view representation of a structure containing a substrate, a seed layer overlying the substrate in the first region, and a superconducting film overlying the first and second regions.

FIG. 3 shows a structure in which one intermediate layer is a seed layer. The lowest stratum is a substrate (18). The next stratum consists of one or more seed layers (20) which extends over a portion of the substrate. The area above and below the seed layer (20) are defined as the "first region", and the remainder of the structure is defined as the "second region". The uppermost stratum is a superconducting film (22,26) which extends over both the first region and the second region. The superconducting film has grown with one orientation (22) on the seed layer and with a different orientation (26) on the substrate. As a result, a weak-link grain boundary junction (24) exists in the superconducting film at the juncture between the first region and the second region.

It is always possible to slope seed layers, such as the seed layer shown in FIG. 3. Some of our data suggest that one method of achieving a more clearly defined weak-link grain boundary junction is to physically remove the sharp shoulder of intermediate layers and slope them, so their surface has an angle of less than 45° with the surface of the substrate. Some data even suggest that it is desirable to slope the intermediate layers so they have an angle of less than 10 with the surface of the substrate.

In the interest of illustrating the rich variety of materials from which the structure shown in FIG. 3 can be made, we will describe four different embodiments of the structure and the methods of making them. In all the following embodiments of FIG. 3, the superconducting film material is arbitrarily chosen to be YBCO. The YBCO grows with two different orientations, labelled "HTS" and HTS'". In seven of the structures (i, ii, iv, v, vi, vii, and viii), a 45° in-plane weak-link grain boundary junction (24) exists in the superconducting film at the juncture between the first region and the second region. In one of the structures (iii), the weak-link grain boundary junction (24) is an out-of-plane grain boundary junction. The language of the structures and the language of the methods seem so nearly identical as to be redundant; we recite both because patent law requires us to disclose every aspect of the invention in detail with unmistakable clarity.

(i) The substrate material (18) is YSZ[100](001), the seed layer material (20) is YBCO[100](001), and the superconducting film material (22,26) is YBCO oriented [100](001) in the first region (22) and [110](001) in the second region (26).

The method of fabricating this structure consists of growing a seed layer of YBCO[100](001) over the first region a substrate of YSZ[100](001), and then growing a superconductingfilm of YBCO, which orients [100](001) in the first region and [110](001) in the second region.

In this case, it is necessary to grow the seed layer of YBCO under one set of growth conditions and the superconducting film layer of YBCO under different growth conditions in order to achieve two different crystal orientations of YBCO in contact with the same YSZ substrate. The methods of adjusting the growth conditions are known to people skilled in the art of HTS thin film deposition. YBCO is a useful seed, because when a second layer of YBCO grows on top of it, the second layer will adopt the same crystal orientation as the first layer under virtually any growth conditions.

(ii) The substrate material (18) is YSZ[100](001), the seed layer material (20) is YBCO[110](001), and the superconducting film material (22,26) is YBCO oriented [110](001) in the first region (22) and [100](001) in the second region (26).

The method of fabricating this structure consists of growing a seed layer of YBCO[110](001) over the first region of a substrate of YSZ[100](001), and growing a superconducting film of YBCO, which orients [110](001) in the first region and [100](001) in the second region.

This structure is, in one sense, the reverse of the previous structure. As before, it is necessary to grow the different layers of YBCO under different growth conditions in order to achieve two different crystal orientations of YBCO on the same YSZ substrate.

(iii) The substrate material (18) is YSZ[100](001), the seed layer material (20) is SrTiO$_3$(110), and the superconducting film material (22,26) is YBCO oriented either (110), (103), or a mixture thereof in the first region (22) and [110](001) in the second region.

In this structure, an out-of-plane weak-link grain boundary junction (24) exists in the superconducting film at the juncture between the first and second regions. (In all the other embodiments of FIG. 3 specified in this document, the junction is an in-plane weak-link grain boundary junction.)

The method of fabricating this structure consists of growing a seed layer of SrTiO$_3$(110) over the first region of a substrate of YSZ[100](001), and then growing a superconducting film of YBCO, which orients either (110), (103), or a mixture thereof in the first region (22) and [110](001) in the second region.

(iv) The substrate material (18) is selected from SrTiO$_3$ [100](001), CaTiO$_3$[100](001), and LaAlO$_3$[100](001); the seed layer material (20) is YSZ[110](001); and the superconducting film material (22,26) is YBCO oriented [110](001) in the first region and [100](001) in the second region.

The method of fabricating this structure consists of growing a seed layer of YSZ[110](001) over the first region of a substrate whose material is selected from SrTiO₃[100](001), CaTiO₃[100](001), and LaAlO₃[100](001), and then growing a superconducting film of YBCO, which orients [110](001) in the first region and [100](001) in the second region.

Figure 4

Another generic method of growing the superconducting film in the first region with a different crystal orientation compared to the superconducting film in the second region consists of the following steps: growing one or more seed layers over a portion of the substrate extending over the first region, growing one or more buffer layers over both the first region and the second region, and growing a superconducting film over both the first region and the second region. This strategy yields the structure shown in FIG. 4.

Figure 4:
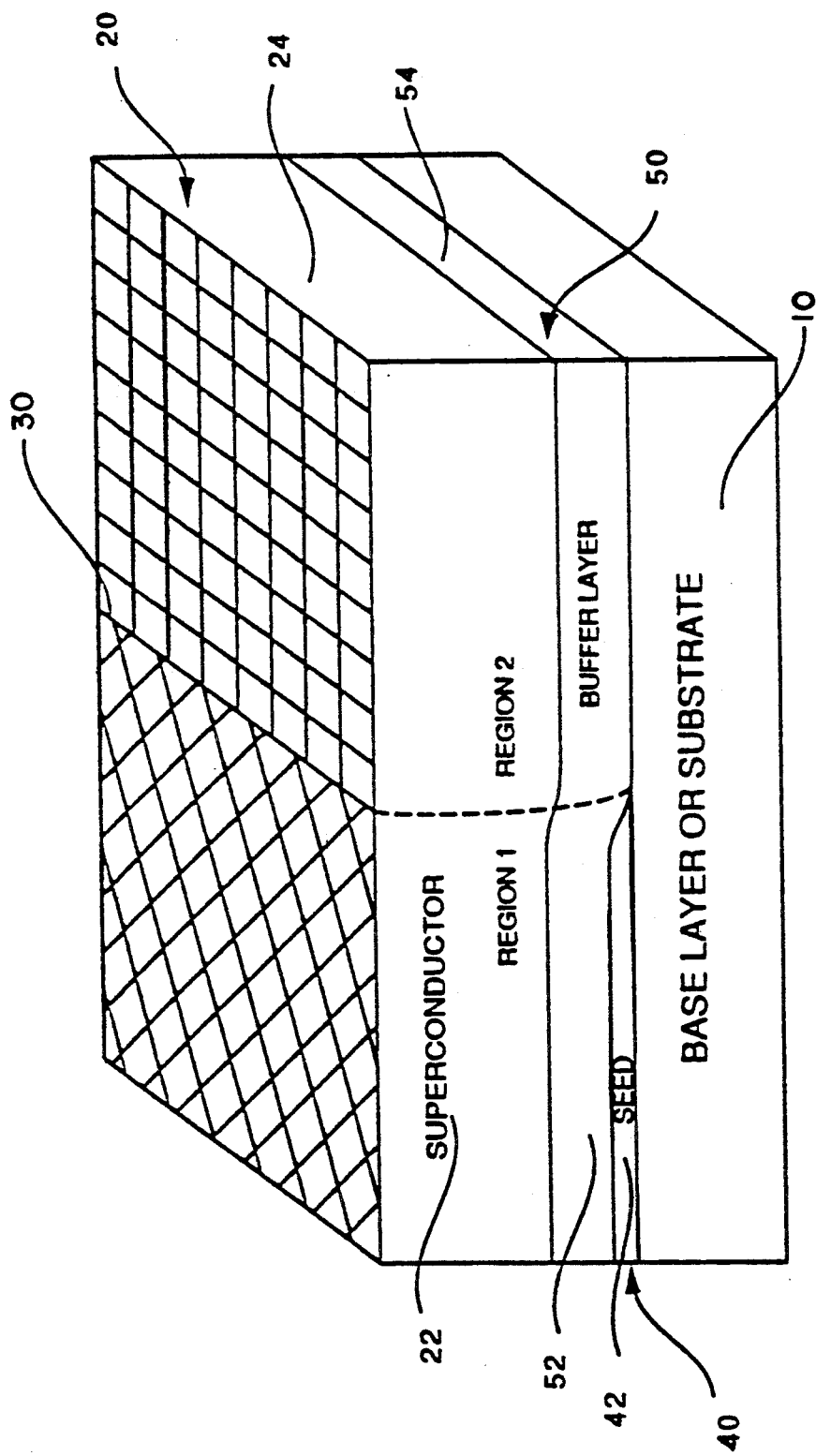
FIG. 4 is a schematic side-view representation of a structure containing a substrate, a seed layer overlying the substrate in the first region, a buffer layer overlying the first and second regions, and a superconducting film overlying the first and second regions.

In FIG. 4, the lowest stratum is a substrate (28). The next stratum consists of one or more seed layers (29) which extend over a portion of the substrate in the first region. The next stratum consists of one or more buffer layers (30, 31), labelled "Buffer" and "Buffer'", which have one orientation (30) in the first region and a different orientation (31) in the second region. The uppermost stratum is a superconducting film (32,33), which extends over both the first region and the second region. The superconducting film has grown with one orientation (32) in the first region and a second orientation (33) in the second region. As a result, a weaklink grain boundary junction (34) exists in the superconducting film at the juncture between the first region and the second region.

The buffer layer (30,31) can consist of materials which provide an intermediate lattice match between the layers above and below. The purpose of this strategy is to minimize stress, cracking, and defect structures in the weak-link grain boundary junction or the superconducting films.

We will describe five different embodiments of the structure shown in FIG. 4 and the methods of fabricating them. In all these embodiments, the superconducting film material is arbitrarily chosen to be YBCO. The YBCO grows with two different orientations, and a 45° weak-link in-plane grain boundary junction exists in the superconducting film at the juncture between the first region and the second region.

(i) The material of the substrate (28) is r-plane Al₂O₃ [$\bar{2}$021](1$\bar{1}$02). The material of the seed layer (29) is MgO[110](001). The material of the buffer layer (30,31) is SrTiO₃, oriented [110](001) in the first region (30) and [100](001) in the second region (31). The material of the superconducting film (32,33) is YBCO, oriented [110](001) in the first region (32) and [100](001) in the second region (33).

The method of fabricating this structure consists of growing a seed layer of MgO[110](001) over the first region of a substrate of r-plane Al₂O₃[$\bar{2}$021](1$\bar{1}$02), growing a buffer layer of SrTiO₃, which orients [110](001) in the first region and [100](001) in the second region, and then growing a superconducting film of YBCO, which orients [110](001) in the first region and [100](001) in the second region.

(ii) The material of the substrate (28) is r-plane Al₂O₃ [$\bar{2}$021](1$\bar{1}$02). The material of the seed layer (29) is SrTiO₃ [100](001). The materials of the buffer layer (30,31) are a layer of MgO, oriented [100](001) in the first region (30) and [110](001) in the second region (31), followed by a layer of SrTiO₃ (not explicitly shown), also oriented [100](001) in the first region and [110](001) in the second region. The material of the superconducting film (32,33) is YBCO oriented [100] (001) in the first region (32) and [110](001) in the second region (33).

The method of fabricating this structure consists of growing a seed layer of SrTiO₃[100](001) over the first region of a substrate of r-plane Al₂O₃[$\bar{2}$021](1$\bar{1}$02), growing a layer of MgO, oriented [100](001) in the first region and [110](001) in the second region, followed by a layer of SrTiO₃ also oriented [100](001) in the first region and [110](001) in the second region, and then growing a superconducting film of YBCO, which orients [100](001) in the first region and [110] (001) in the second region.

(iii) The material of the substrate (28) is r-plane Al₂O₃ [$\bar{2}$021](1$\bar{1}$02). The material of the seed layer (29 is MgO[100] (001). The material of the buffer layer (30,31) is selected from LaAlO₃, SrTiO₃, and CaTiO₃, oriented [110](001) in the first region (30) and [100](001) in the second region (31). The material of the superconducting film (32,33) is YBCO oriented [110](001) in the first region (32) and [100](001) in the second region (32).

The method of fabricating this structure consists of growing a seed layer of MgO[110](001) over the first region of a substrate of r-plane Al₂O₃[$\bar{2}$021](1$\bar{1}$02); growing one or more buffer layers, selected from LaAlO₃, SrTiO₃, and CaTiO₃, which orient [110](001) in the first region and [100](001) in the second region; and growing a superconducting film of YBCO, the second region.

(iv) The material of the substrate (28) is r-plane Al₂O₃ [$\bar{2}$021](1$\bar{1}$02). The material of the seed layer (29) is selected from SrTiO₃[100](001) and CaTiO₃[100](001). The material of the buffer layer (30,31) is MgO oriented [100](001) in the first region and [110](001) in the second region. The superconducting film (32,33) is YBCO oriented [100](001) in the first region (32) and [110](001) in the second region (33).

The method of fabricating this structure consists of growing a seed layer, whose material is selected from SrTiO₃ [100](001), or CaTiO₃[100](001) over the first region of a substrate of r-plane Al₂O₃[$\bar{2}$021](1$\bar{1}$02); growing a buffer layer of MgO, which orients [100](001) in the first region and [110](001) in the second region; and then growing a superconducting film of YBCO, which orients [100](001) in the first region and [110](001) in the second region.

(v) The material of the substrate (28) is r-plane Al₂O₃ [$\bar{2}$021](1$\bar{1}$02). The material of the seed layer (29) is YSZ (001). The material of the buffer layer (30,31) is SrTiO₃, oriented (110) in the first region (30) and (001) in the second region (31). The material of the superconducting film (32,33) is YBCO oriented either (110), (103), or a mixture thereof in the first region (32) and (001) in the second region (33).

The method of fabricating this structure consists of growing a seed layer of YSZ(001) in the first region of a substrate of r-plane Al₂O₃[$\bar{2}$021](1$\bar{1}$02), growing a buffer layer of SrTiO₃, which orients (110) in the first region and (001) in the second region, and growing a superconducting film of YBCO, which orients either (110), (103) or a mixture thereof in the first region and (001) in the second region.

Figure 5

Still another generic method of growing the superconducting film in the first region with a different crystal orientation compared to the superconducting film in the second region consists of the following steps: growing one or more seed layers and one or more buffer layers over a portion of the substrate which extends over the first region, then growing one or more buffer layers over both the first region and the second region, and finally growing a superconducting film over both the first region and the second region. This strategy yields the structure shown in FIG. 5.

Figure 5:
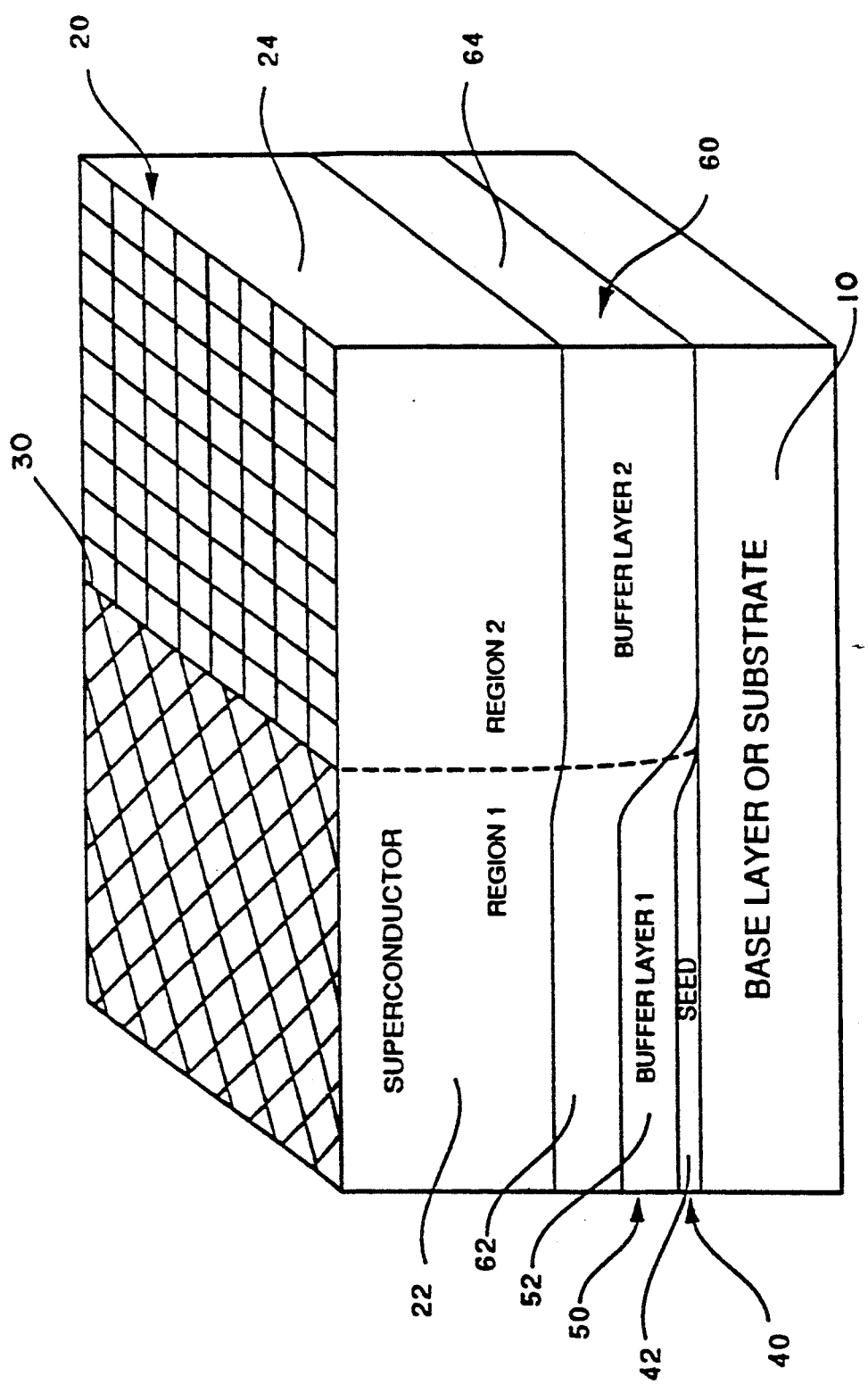
FIG. 5 is a schematic side-view representation of a structure containing a substrate, a seed layer overlying the substrate in the first region, a buffer layer overlying the seed layer in the first region, a second buffer layer overlying the first and second regions, and a superconducting film overlying both regions.

In FIG. 5, the lowest stratum is a substrate (36). The next stratum consists of one or more seed layers (38) and one or more buffer layers (40) which extend over a portion of the substrate in the first region. (This buffer layer (40) is useful for protecting a seed layer during processing.) The next stratum consists of one or more buffer layers (42,44) which grow with one orientation in the first region (42) and with a different orientation in the second region (44). The uppermost stratum is a superconducting film (46,48), which extends over both the first region and the second region. The superconducting film has grown with one orientation (46) in the first region and a second orientation (48) in the second region. As a result, a weak-link grain boundary junction (50) exists in the superconducting film at the juncture between the first region and the second region.

We will describe two different embodiments of the structure shown in FIG. 5 and the methods of fabricating them. Once again, in all these embodiments of FIG. 5 the superconducting film material is arbitrarily chosen to be YBCO, the YBCO grows with two different orientations, and a 45° weaklink in-plane grain boundary junction exists in the superconducting film at the juncture between the first region and the second region.

(i) The material of the substrate (36) is r-plane $Al_2O_3$ $[\bar{2}021](1\bar{1}02)$. The material of the seed layer (38) is MgO[110] (001). The material of the first buffer layer (40) is $SrTiO_3$ 110](001). The material of the next buffer layer (42,44) is $SrTiO_3$, oriented [110](001) in the first region and [100](001) in the second region. The material of the superconducting film (46,48) is YBCO oriented [110](001) in the first region and [100](001) in the second region.

The method of fabricating this structure consists of growing a seed layer of MgO[110](001) and a buffer layer of $SrTiO_3$[110](001) over the first region of a substrate of r-plane $Al_2O_3[\bar{2}021](1\bar{1}02)$; growing a buffer layer of $SrTiO_3$, which orients [110](001) in the first region and [100](001) in the second region; and then growing a superconducting film of YBCO, which orients [110](001) in the first region and [100] (001) in the second region.

(ii) The material of the substrate (36) is r-plane $Al_2O_3$ $[\bar{2}021](1\bar{1}02)$. The material of the seed layer (38) is MgO[110] (001). The material of the buffer layer (40) is $SrTiO_3$[110] (001). The materials of the buffer layers (42,44) are selected from among $LaAlO_3$, $SrTiO_3$, and $CaTiO_3$, oriented [110](001) in the first region (42) and [110](001) in the second region (44). The material of the superconducting film (46,48) is YBCO, oriented [110](001) in the first region and [100](001) in the second region.

The method of fabricating this structure consists of growing a seed layer of Mgo[110](001) and a buffer layer of $SrTiO_3$[110](001) over the first region of a substrate of r-plane $Al_2O_3[\bar{2}021](1\bar{1}02)$; growing one or more buffer layers selected from $LaAlO_3$, $SrTiO_3$, and $CaTiO_3$, which orient [110] (001) in the first region and [100](001) in the second region; and then growing a superconducting film of YBCO, which orients [110](001) in the first region and [100](001) in the second region.

Figure 6

Yet another generic method of growing the superconducting V film in the first region with a different crystal orientation compared to the superconducting film in the second region consists of the following steps: growing one or more buffer layers which extend over both the first region and the second region of a substrate, growing one or more seed layers which extend over only the first region, and growing a superconducting film over both the first region and the second region. This strategy yields the structure shown in FIG. 6. This method is especially useful for growing on chemically reactive substrates.

Figure 6:
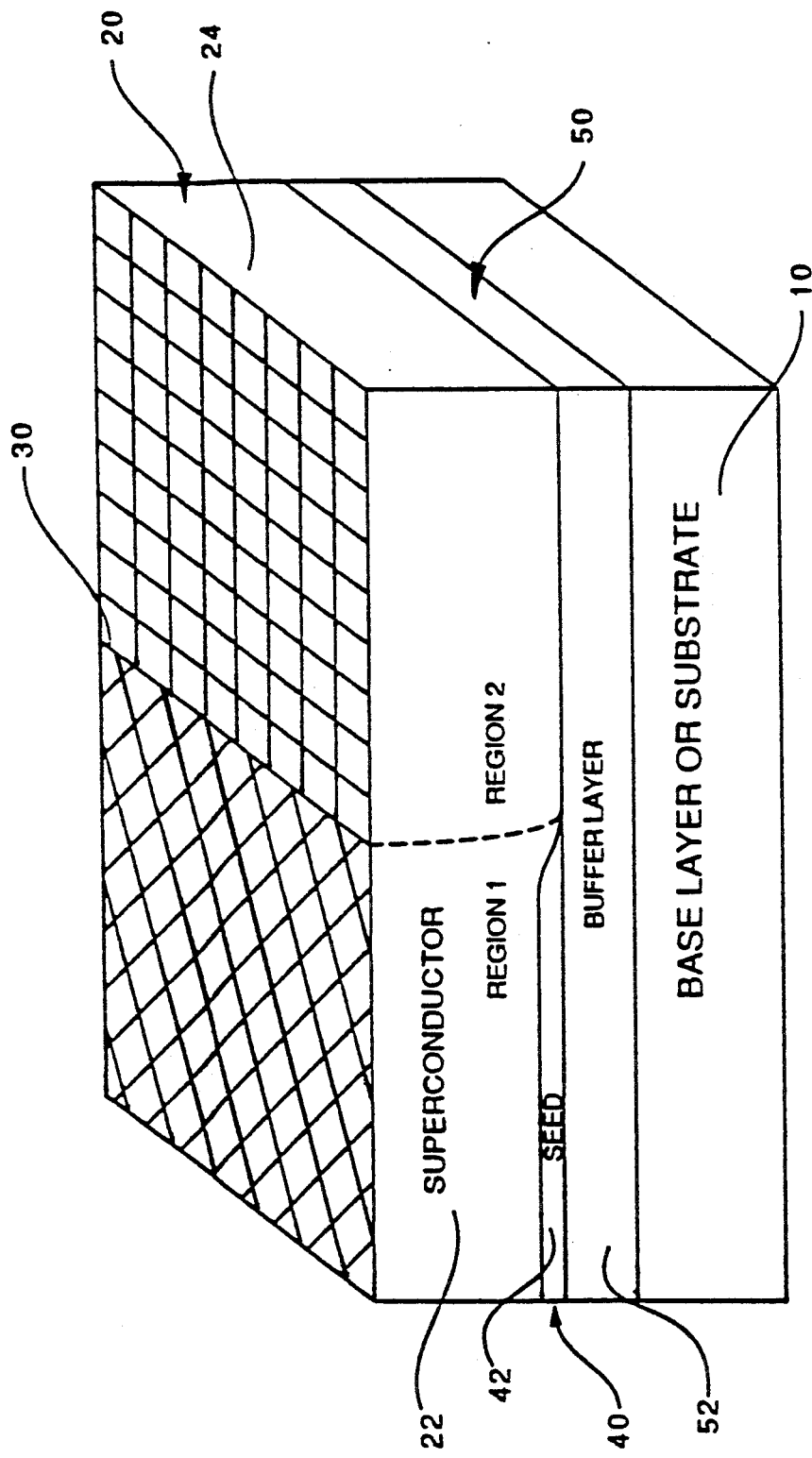
FIG. 6 is a schematic side-view representation of a structure containing a substrate, a buffer layer, a seed layer overlying the first region, and a superconducting film overlying the first and second regions.

In FIG. 6, the lowest stratum is a substrate (52). The next stratum consists of one or more buffer layers (54) which extend over both the first region and the second region. The next stratum consists of one or more seed layers (56) which extend over the first region. The uppermost stratum consists of a superconducting film (58,60), which extends over both the first region and the second region. The superconducting film has grown with one orientation (58) in the first region and a second orientation (60) in the second region. As a result, a weak-link grain boundary junction (62) exists in the superconducting film at the juncture between the first region and the second region.

Figure 7

Yet another generic method of growing the superconducting film in the first region with a different crystal orientation compared to the superconducting film in the second region consists of the following steps: growing one or more buffer layers which extend over both the first region and the second region of a substrate, growing one or more seed layers which extend over only the first region, growing one or more buffer layers which extend over both the first and second regions, and growing a superconducting film over both the first region and the second region. This strategy yields the structure shown in FIG. 7.

Figure 7:
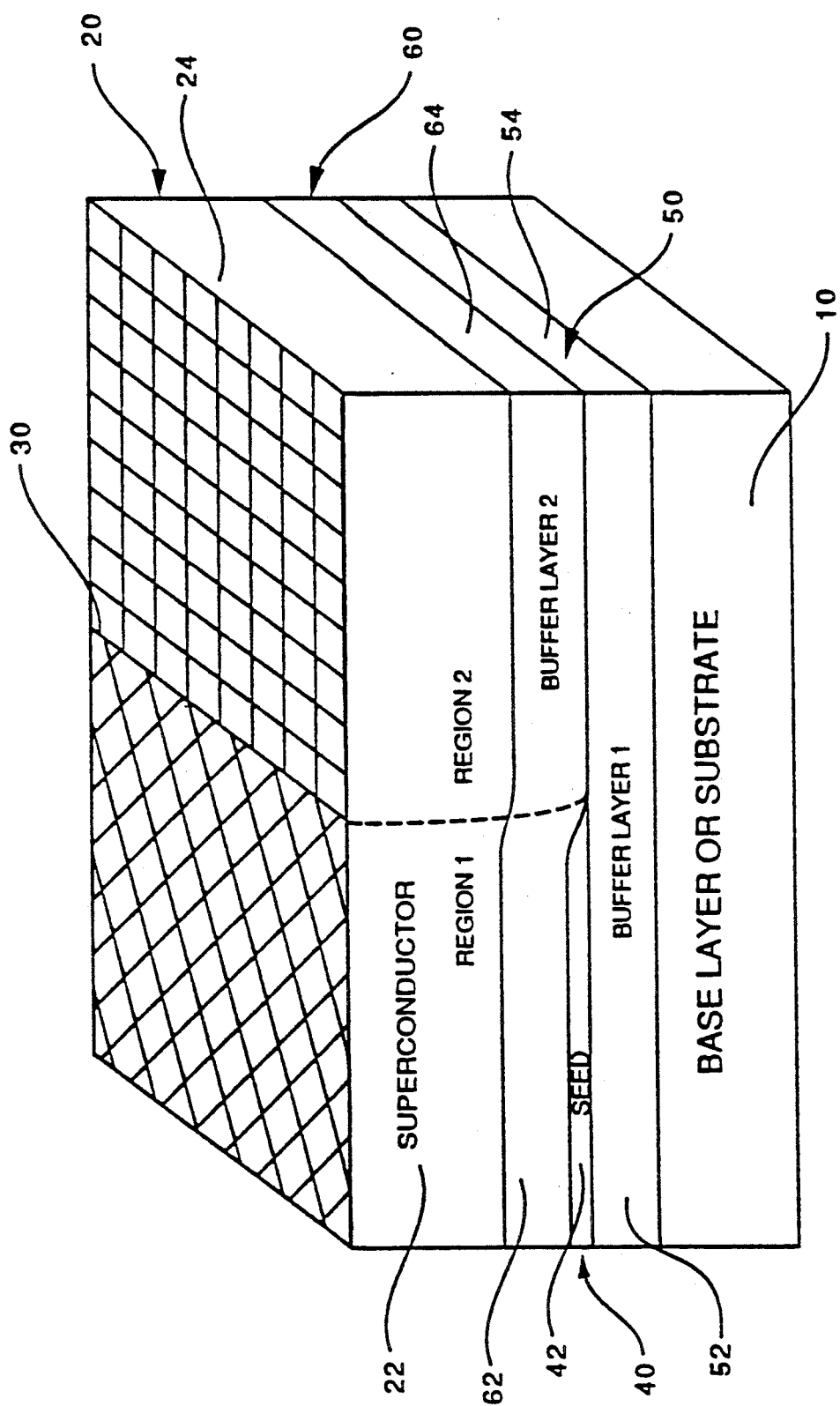
FIG. 7 is a schematic side-view representation of a structure containing a substrate, a buffer layer, a sloped seed layer overlying the first region, a buffer layer overlying the first and second regions, and a superconducting film overlying the first and second regions.

In FIG. 7, the lowest stratum is a substrate (64). The next stratum consists of one or more buffer layers (66) which extend over both the first region and the second region. The next stratum consists of one or more seed layers (68) which extend over the first region. The next stratum consists of one or more buffer layers (70,72) which extend over both the first region and the second region, adopting one orientation in the first region (70) and a different orientation in the second region (72). The uppermost layer (74,76) is a superconducting film which extends over both the first region and the second region. The superconducting film has grown with one orientation (74) in the first region and a second orientation (76) in the second region. As a result, a weak-link grain boundary junction (78) exists in the superconducting film at the juncture between the first region and the second region.

Figure 8

Still another generic method of growing the superconducting film in the first region with a different crystal orientation compared to the superconducting film in the second region consists of the following steps: growing onto a substrate one or more seed layers which extend over the first region and one or more seed layers which extend over the second region, and growing a superconducting film over both the first region and the second region. This strategy yields the structure shown in FIG. 8.

Figure 8:
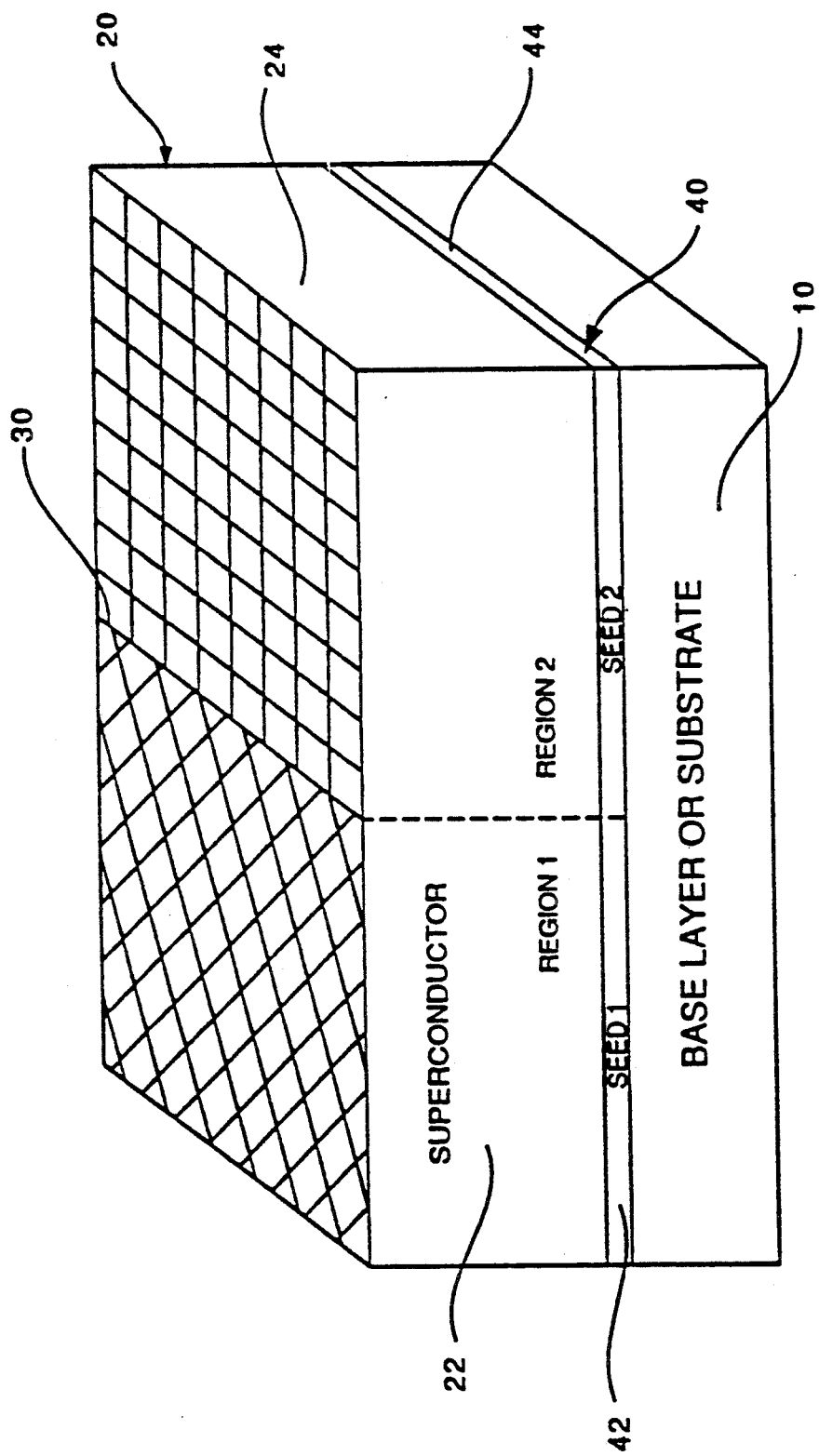
FIG. 8 is a schematic side-view representation of a structure containing a substrate, a seed layer overlying the first region, a second seed layer overlying the second region, and a superconducting film overlying the first and second regions.

In FIG. 8, the lowest stratum is a substrate (80). The next stratum is a composite stratum, in which one or more seed layers (82) extend over the first region and one or more seed layers (84) extend over the second region. The uppermost stratum is a superconducting film (86,88) which extends over both the first region and the second region. The superconducting film has grown with one orientation (86) in the first region and a second orientation (88) in the second region. As a result, a weak-link grain boundary junction (90) exists in the superconducting film at the juncture between the first region and the second region.

We will cite one specific embodiment of the structure shown in FIG. 8. The material of the substrate (80) is YSZ[100](001). The next stratum is a composite stratum in which the material of the seed layer (82) which extends over the first region is YBCO[100](001), and the material of the seed layer (84) which extends over the second region is YBCO [110](001). The material of the superconducting film (86,88) is YBCO oriented [110](001) in the first region and [100](001) in the second region. A 45° in-plane weak-link grain boundary junction (90) exists at the juncture between the first and second regions.

The method of fabricating this structure consists of the following steps: growing onto a substrate of YSZ[100](001) a seed layer of YBVCO[100](001) which extends over the first region and a seed layer of YBCO[110](001) which extends over the second region, and then growing over both a superconducting film of YBCO, which orients [110](001) in the first region and [100](001) in the second region.

Figure 9

Still another generic method of growing the superconducting film in the first region with a different crystal orientation compared to the superconducting film in the second region consists of the following steps: growing onto a substrate one or more seed layers which extend over the first region and one or more seed layers which extend over the second region, growing one or more buffer layers which extend over both the first and second regions, and growing a superconducting film over both the first region and the second region. This strategy yields the structure shown in FIG. 9.

Figure 9:
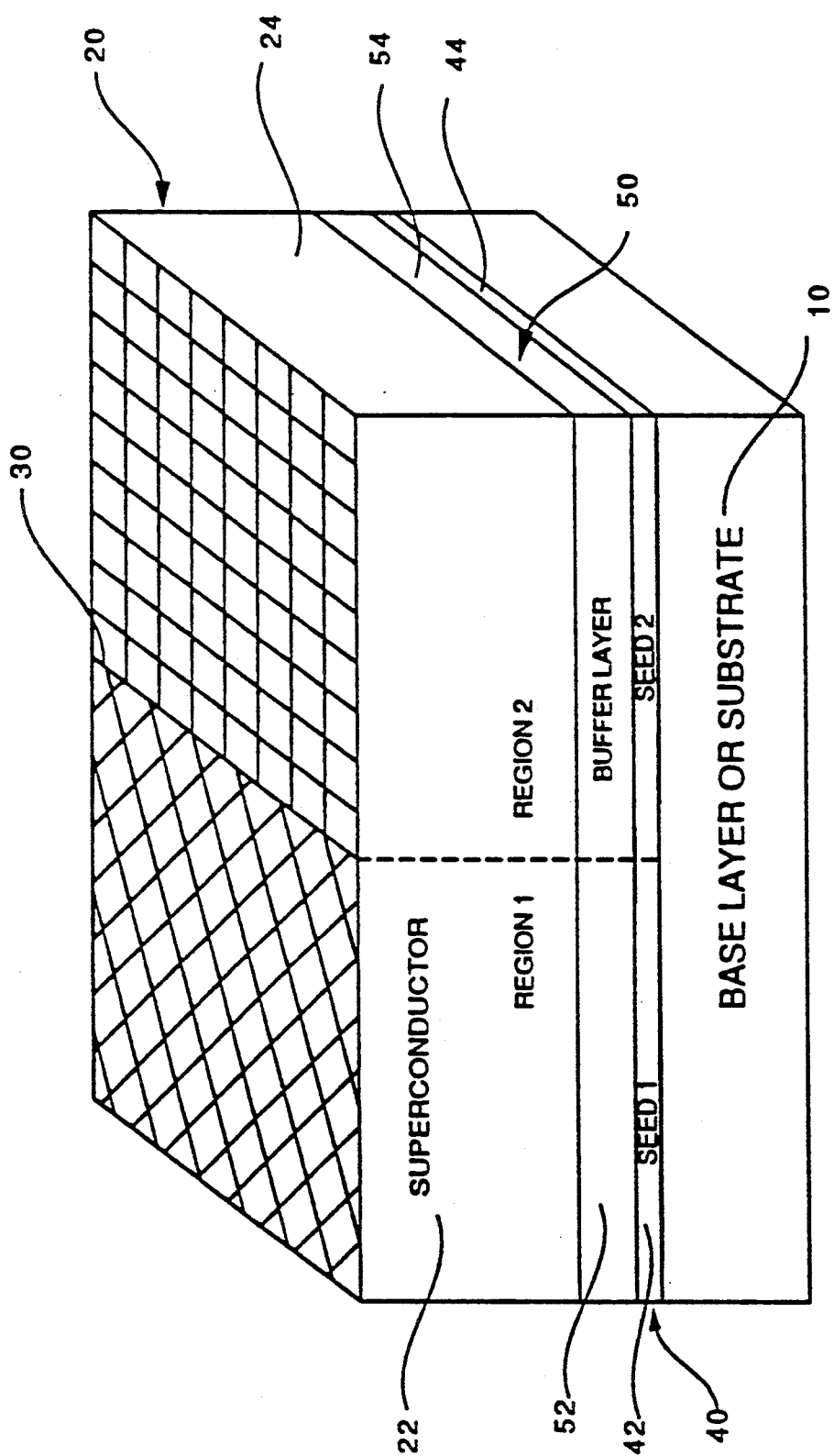
FIG. 9 is a schematic side-view representation of a structure containing a substrate, a seed layer overlying the first region, a second seed layer overlying the second region, a buffer layer overlying the first and second regions, and a superconducting film overlying the first and second regions.

In FIG. 9 the lowest stratum (120) is a substrate. The next stratum is a composite stratum in which one or more seed layers (122) extend over the first region and one or more seed layers (124) extend over the second region. The next stratum consists of one or more buffer layers (126,128) which extend over both the first region and the second region. The uppermost stratum is a superconducting film (130,132) which extends over both the first region and the second region. A weak-link grain boundary junction (134) exists in the superconducting film at the juncture between the first and second regions.

We will cite one specific example of the structure shown in FIG. 9. The material of the substrate (120) is YSZ[100] (001). The materials of the seed layer (122) which extends over the first region is YBCO[100](001). The material of the seed layer (124) which extends over the second region is YBCO [100](001). The material of the buffer layer (126, 128) is $SrTiO_3$, oriented [100](001) in the first region and [110](001) in the second region. The material of the superconducting film (130,132) is YBCO oriented [100](001) in the first region and [110](001) in the second region. A 45° in-plane weak-link grain boundary junction (134) exists in the superconducting film at the juncture between the first region (130) and the second region (132).

The method of fabricating this structure consists of the following steps: growing onto a substrate of YSZ[100](001) a seed layer of YBCO[100](001) which extends over the first region and a seed layer of YBCO[110](001) which extends over the second region, then growing a buffer layer of $SrTiO_3$, which orients [100](001) in the first region and [110](001) in the second region, and finally growing a superconducting film of YBCO, which orients [100](001) in the first region and [110](001) in the second region.

Figure 10

We offer yet another generic method of growing the superconducting film in the first region with a different crystal orientation compared to the superconducting film in the second region: growing onto a substrate one or more buffer layers which extend over both the first region and the second region, growing one or more seed layers which extend over the first region and one or more seed layers which extend over the second region, growing one or more buffer layers which extend over both the first and second regions, and growing a superconducting film over both the first region and the second region. This strategy yields the structure shown in FIG. 10.

Figure 10:
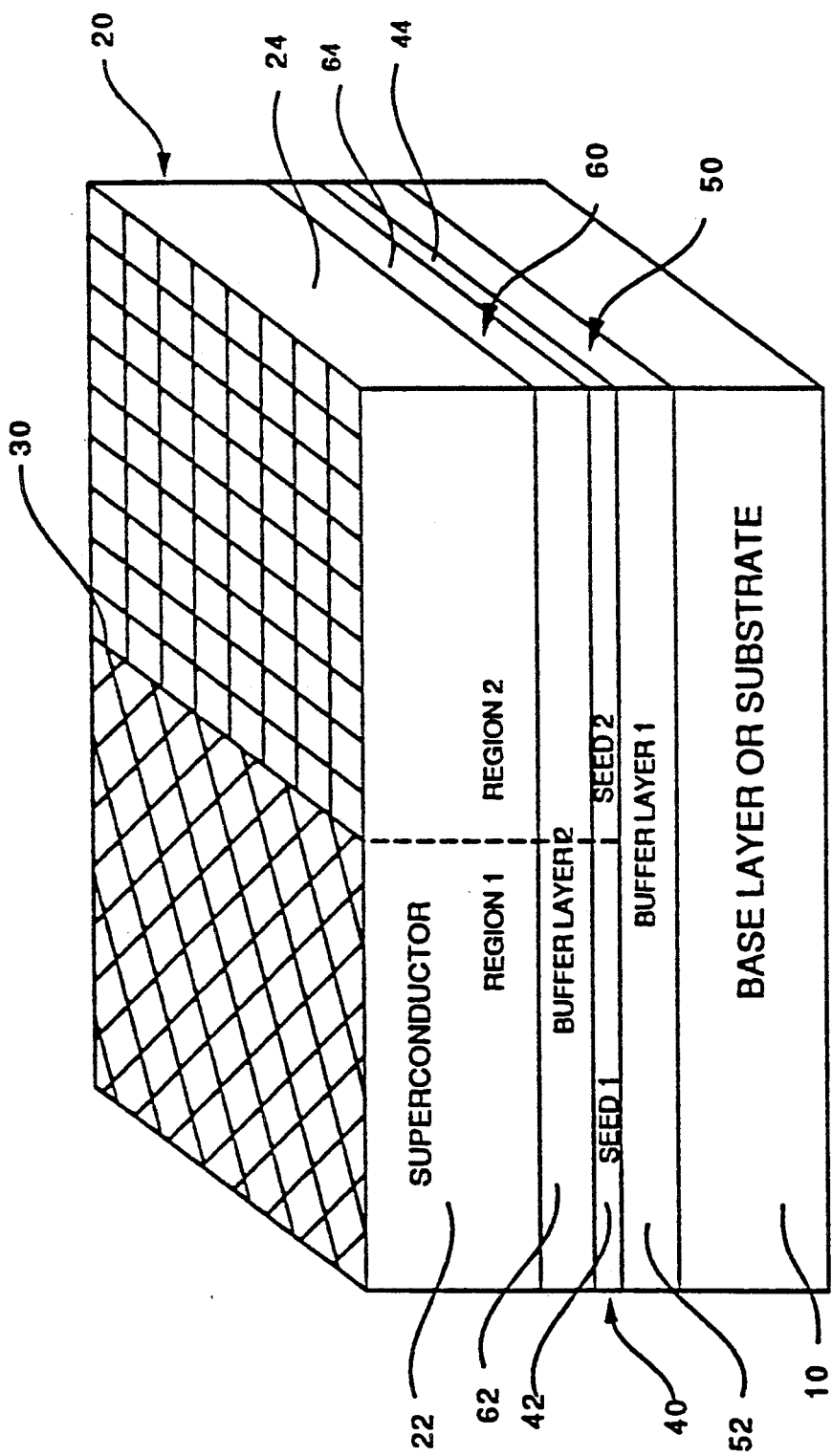
FIG. 10 is a schematic side-view representation of a structure containing a substrate, a buffer layer, a seed layer overlying the first region, a second seed layer overlying the second region, another buffer layer overlying the first and second regions, and a superconducting film overlying the first and second regions.

In FIG. 10, the lowest stratum is a substrate (136). The next stratum consists of one or more buffer layers (138) which extend over both the first region and the second region. The next stratum is a composite stratum in which one or more seed layers (140) extend over the first region and one or more seed layers (142) extend over the second region. The next stratum consists of one or more buffer layers (144,146) which extend over both the first region and the second region. The uppermost stratum is a superconducting film (148,150) which extends over both the first region and the second region. A 45° weak-link grain boundary junction (152) exists at the juncture between the first and second regions.

We have listed several examples of structures which can be grown by combinations of seed layers and buffer layers. The number of possible structures which will create weak-link grain boundary junctions is obviously very large; the examples we have cited are meant to be illustrative rather than comprehensive.

Reduction to Practice

Figure 11:
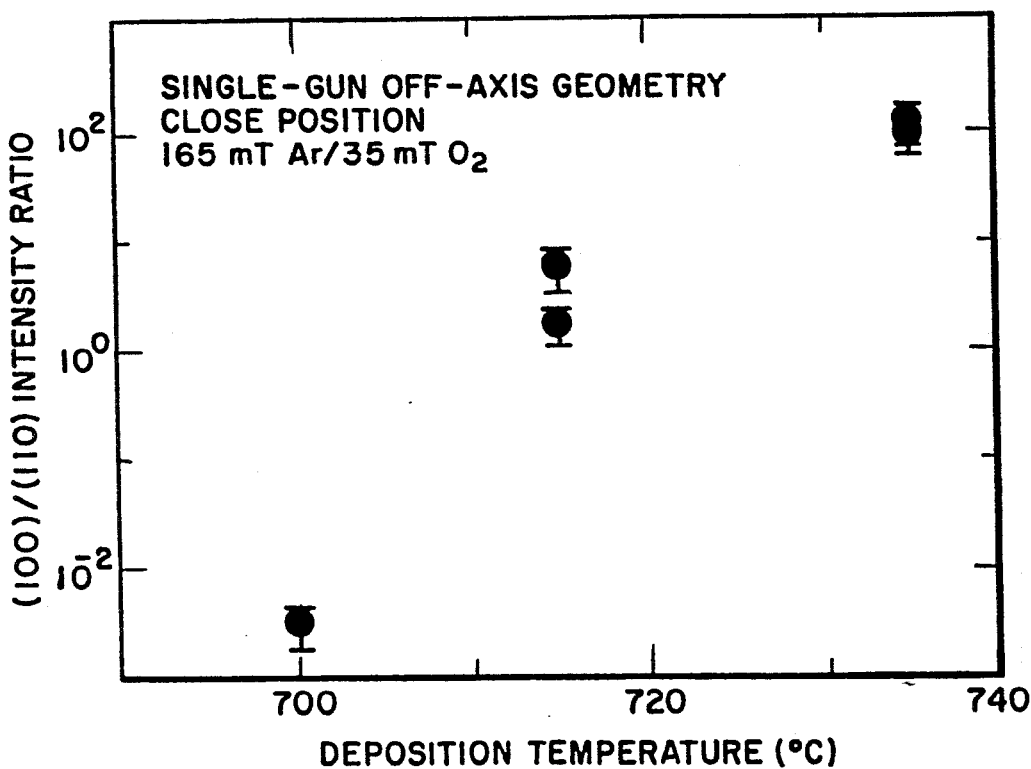
FIG. 11 is a plot of relative crystalline orientation versus film growth temperature for YBCO grown on a YSZ substrate, illustrating the effect of processing conditions on crystalline orientation.

In order to fabricate some of these structures, it is necessary to have an understanding of how processing conditions affect crystalline orientation. We have developed this capability for the materials discussed above, and present an example of how film growth temperature affects the orientation of YBCO films grown on YSZ substrates. FIG. 11 shows how a 40° C. change in film growth temperature can induce two completely different in-plane crystalline orientations with respect to the YSZ substrate.

Figure 12:
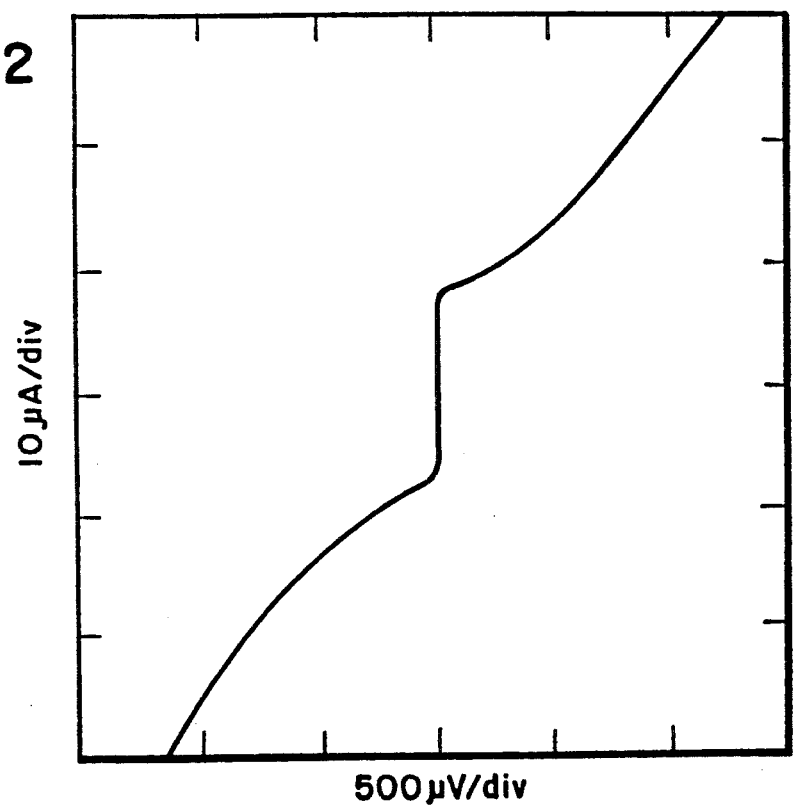
FIG. 12 is a current-voltage (I-V) plot for a weak-link grain boundary junction of the type shown in FIG. 4.

FIG. 12 shows the I-V characteristics of a patterned YBCO line that contains a grain boundary junction of the type shown in FIG. 4 with the materials specified in subsection (i). This figure illustrates that the weak link grain boundary junctions have desirable I-V characteristics.

Figure 13:
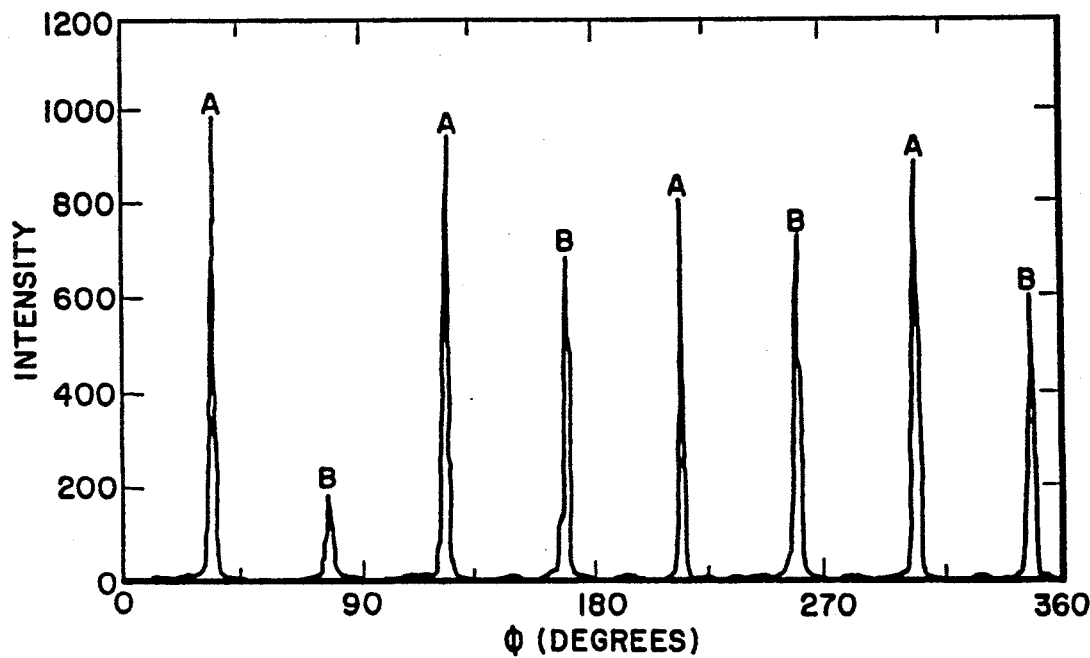
FIG. 13 is an x-ray $\phi$ scan of the structure seen in FIG. 4.

FIG. 13 shows an X-ray $\phi$ scan (YBCO (103) peaks) of the structure shown in FIG. 4 with the materials specified in subsection (i). The B peaks are due to in-plane epitaxy of the YBCO/SrTiO$_3$/Al$_2$O$_3$ multilayer region. The 4 peaks labelled "A" are due to the YBCO/SrTiO$_3$/MgO/Al$_2$O$_3$ regions of the bicrystal which are rotated 45° with respect to the B peaks. This X-ray scan demonstrates that a 45° in-plane weak-link grain boundary junction has been created through standard lithographic techniques.

Figure 14:
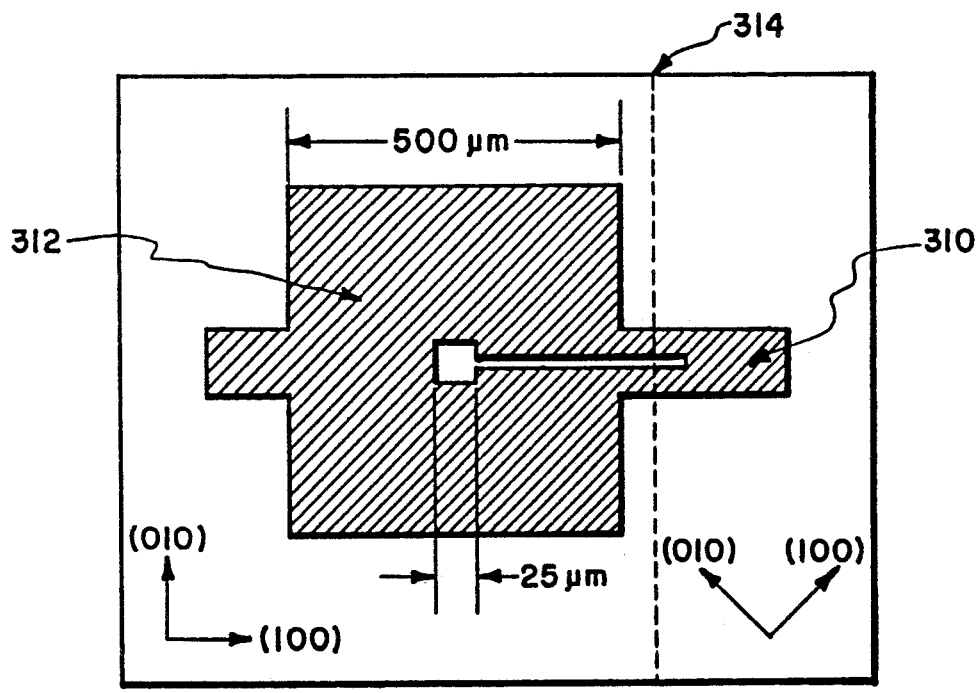
FIG. 14 is a schematic diagram of a SQUID employing weak-link grain boundary junctions of the type described in this document.

FIG. 14 illustrates a dc SQUID, one of the many possible superconducting device structures that can be fabricated by this technique. It shows a dc SQUID, in a square washer configuration, fabricated from a superconducting film of YBCO which contains two weak link grain boundary junctions. The line (314) which defines the grain boundary between the regions (310,312) can be utilized to pattern a plurality of SQUIDs along the same line. Furthermore, other lines parallel or perpendicular to the first line can be defined by means of combined growth and lithographic steps. SQUIDs could be interconnected into an array. The resolution and packing density are much higher and more easily achieved than any weak-link structures one could fabricate with technology based on the prior art.

Figure 15:
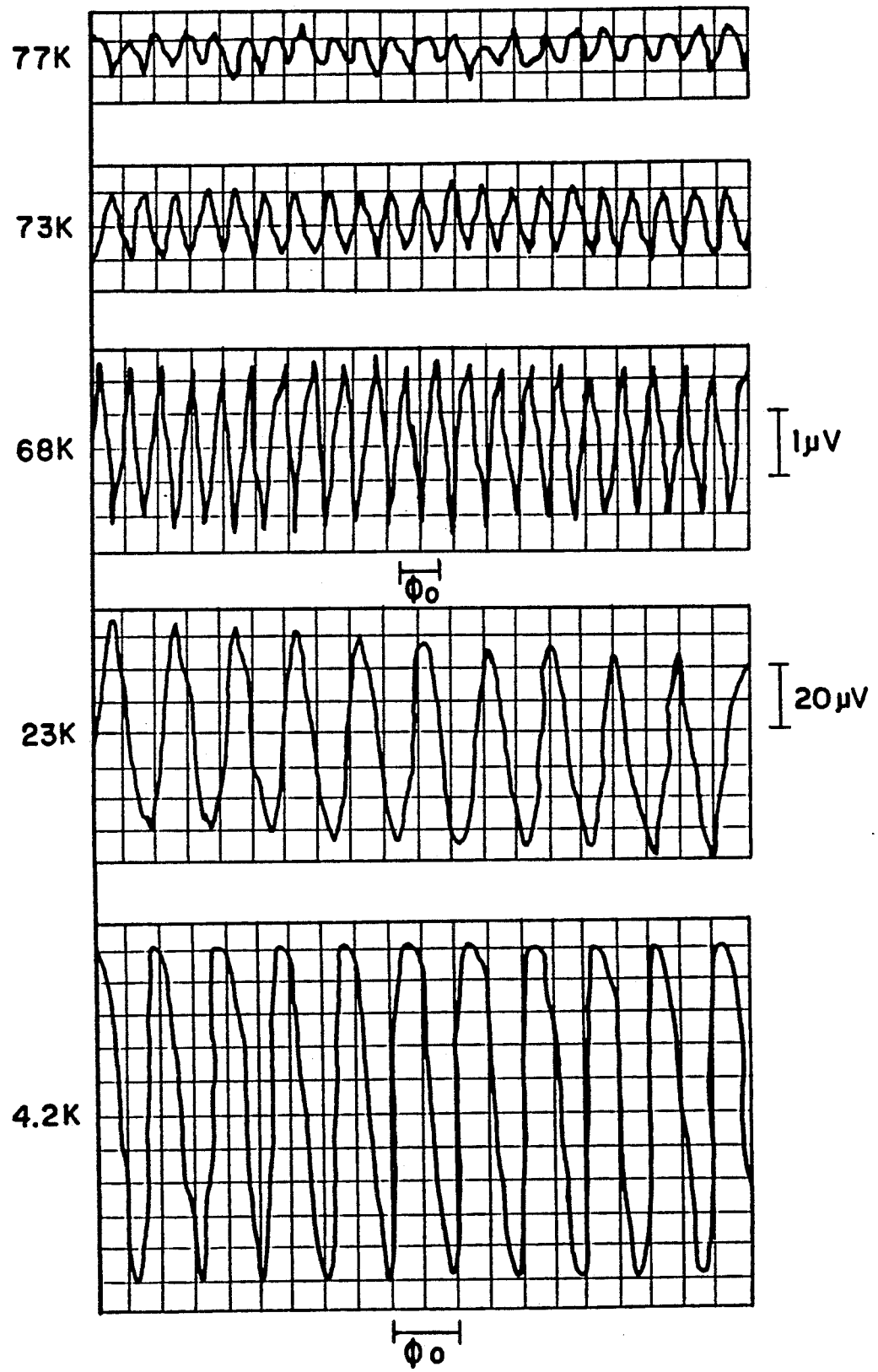
FIG. 15 is a plot of SQUID voltage versus magnetic field (V-phi), showing the output from the device described in FIG. 14. $\phi_0$ refers to a single fluxon of magnetic field.

FIG. 15 illustrates the modulation of voltage across the SQUID as a function of applied magnetic field. This modulation confirms that the weak link junctions operate properly in a SQUID at temperatures ranging from 4K to 77K.

We claim:

1. A structure comprising a first vertical region and a second vertical region adjacent said first region, and a border between said first region and said second region,
    a uniform substrate having a planar surface extending into both of said regions,
    one or more intermediate layers overlying said substrate, at least one of said intermediate layers comprising a seed layer which overlies said substrate in said first region only,
    a superconducting film overlying said substrate and said intermediate layers, said superconducting film in said first region having a different crystal orientation than said superconducting film in said second region,
    a weak-link junction formed in said superconducting film by the mismatch in orientation along said border between said superconducting layer in said first region and said superconducting layer in said second region.

2. The structure of claim 1 wherein said seed layer in said first region is effective to cause the crystal orientation of said superconducting layer in said first region to differ from the crystal orientation of said superconducting layer in said second region.

3. The structure of claim 2 wherein said intermediate layers comprise one or more seed layers overlying said substrate in said first region, and said superconducting film overlies said seed layers in said first region, and said superconducting film overlies said substrate in said second region.

4. The structure of claim 3 wherein said substrate is yttria-stabilized zirconia having the crystallographic orientation denoted [100](001),
    and said seed layer is yttrium barium copper oxide having the crystallographic orientation denoted [100](001), and said superconducting layer is yttrium barium copper oxide having the crystallographic orientation denoted [100](001) in said first region and having the crystallographic orientation denoted [100](001) in said second region.

5. The structure of claim 3 wherein said substrate is yttria-stabilized zirconia having the crystallographic orientation denoted [100](001),
    and said seed layer is yttrium barium copper oxide having the crystallographic orientation denoted [100](001),
    and said superconducting layer is yttrium barium copper oxide having the crystallographic orientation denoted [100](001) in said first region and having the crystallographic orientation denoted [100](001) in said second region.

6. The structure of claim 3 wherein said substrate is yttria-stabilized zirconia having the crystallographic orientation denoted [100](001),
    said seed layer is strontium titanate having the crystallographic orientation denoted (110),
    and said superconducting layer is yttrium barium copper oxide having a crystallographic orientation chosen form the group consisting of the orientation denoted (110) and the orientation denoted (103) and a mixture of the orientations denote (110) and (103) in said first region and having the crystallographic orientation denoted [110](001) in said second region.

7. The structure of claim 3 wherein said substrate is chosen form the group consisting of strontium titanate having the crystallographic orientation denoted [100](001) and lanthanum aluminate having the crystallographic orientation denoted [100](001) and calcium titanate having the crystallographic orientation denoted [100](001),
    said seed layer is yttria-stabilized zirconia having the crystallographic orientation denoted [110](001),
    and said superconducting layer is yttrium barium copper oxide having the crystallographic orientation denoted [110](001) in said first region and having the crystallographic orientation denoted [100](001) in said second region.

8. The structure of claim 2 wherein said intermediate layers comprise one or more seed layers overlying said substrate in said first region,
    and one or more buffer layers overlying said seed layers in said first region
    and overlying said substrate in said second region,
    and said superconducting film overlies said buffer in said first region and in said second region.

9. The structure of claim 8 wherein said substrate is r-plane alumina having the crystallographic orientation denoted [$\bar{2}$021]($1\bar{1}$02), said seed layer is magnesia having the crystallographic orientation denoted [110](001),
    said buffer layer is strontium titanate having the crystallographic orientation denoted [110](001) in said first region and having the crystallographic orientation denoted [100](001) in said second region, and said superconducting layer is yttrium barium copper oxide having the crystallographic orientation denoted [110](001) in said first region and having the crystallographic orientation denoted [100](001) in said second region.

10. The structure of claim 8 wherein said substrate is r-plane alumina having the crystallographic orientation denoted [2̄021](1̄102), said seed layer is strontium titantate having the crystallographic orientation denoted [100](001), said buffer layer is magnesia having the crystallographic orientation denoted [100](001) in said first region and having the crystallographic orientation denoted [110](001) in said second region underlying strontium titanate having the crystallographic orientation denoted [100](001) in said second region, and said superconducting layer is yttrium barium copper oxide having the crystallographic orientation denoted [100](001) in said first region and having the crystallographic orientation denoted [110](001) in said second region.

11. The structure of claim 8 wherein said substrate is r-plane alumina having the crystallographic orientation denoted [2̄021](1̄102), said seed layer is magnesia having the crystallographic orientation denoted [110](001), said buffer layer is chosen from the group consisting of strontium titanate having the crystallographic orientation denoted [110](001) in said first region and having the crystallographic orientation denoted [100](001) in said second region, lanthanum aluminate having the crystallographic orientation denoted [110](001) in said first region and having the crystallographic orientation denoted [100](001) in said second region, and calcium titanate having the crystallographic orientation denoted [110](001) in said first region and having the crystallographic orientation denoted [100](001) in said second region, and said superconducting layer is yttrium barium copper oxide having the crystallographic orientation denoted [110](001) in said first region and having the crystallographic orientation denoted [100](001) in said second region.

12. The structure of claim 8 wherein said substrate is r-plane alumina having the crystallographic orientation denoted [2̄021](1̄102), said seed layer is chosen from the group consisting of strontium titanate having the crystallographic orientation denoted [100](001) and calcium titanate having the crystallographic orientation denoted [100](001), said buffer layer is magnesia having the crystallographic orientation denoted [100](001) in said first region and having the crystallographic orientation denoted [110](001) in said second region, and said superconducting layer is yttrium barium copper oxide having the crystallographic orientation denoted [100](001) in said first region and having the crystallographic orientation denoted [110](001) in said second region.

13. The structure of claim 8 wherein said substrate is r-plane alumina having the crystallographic orientation denoted [2̄021](1̄102), said seed layer is yttria-stabilized zirconia having the crystallographic orientation denoted (001), said buffer layer is strontium titanate having the crystallographic orientation denoted (110) in said first region and having the crystallographic orientation denoted (001) in said second region, and said superconducting layer is yttrium barium copper oxide having a crystallographic orientation chosen from the group consisting of the orientation denoted (110) and the orientation denoted (103) in said first region and having the crystallographic orientation denoted [110](001) in said second region.

14. The structure of claim 2 wherein said intermediate layers comprise one or more seed layers overlying said substrate in said first region, and one or more buffer layers overlying said seed layers in said first region only, and one or more second buffer layers overlying said first buffer layers in said first region and overlying said substrate in said second region, and said superconducting film overlies said buffer layers in said first region and in said second region.

15. The structure of claim 8 wherein said substrate is r-plane alumina having the crystallographic orientation denoted [2̄021](1̄102), said seed layer is magnesia having the crystallographic orientation denoted [110](001)

said first buffer layer is strontium titanate having the crystallographic orientation denoted [110](001), said second buffer layer is strontium titanate having the crystallographic orientation denoted [110](001) in said first region and having the crystallographic orientation denoted [100](001) in said second region, and said superconducting layer is yttrium barium copper oxide having the crystallographic orientation denoted [110](001) in said first region and having the crystallographic orientation denoted [100](001) in said second region.

16. The structure of claim 14 wherein said substrate is r-plane alumina having the crystallographic orientation denoted [2̄021](1̄102), said seed layer is magnesia having the crystallographic orientation denoted [110](001)

said first buffer layer is strontium titanate having the crystallographic orientation denoted [110](001), said second buffer layer is chosen from the consisting of strontium titanate having the crystallographic orientation denoted [110](001) in said first region and having the crystallographic orientation denoted [100](001) in said second region, lanthanum aluminate having the crystallographic orientation denoted [110](001) in said first region and having the crystallographic orientation denoted [100](001) in said second region, and calcium titanate having the crystallographic orientation denoted [110](001) in said first region and having the crystallographic orientation denoted [100](001) in said second region, and said superconducting layer is yttrium barium copper oxide having the crystallographic orientation denoted [110](001) in said first region and having the crystallographic orientation denoted [100](001) in said second region.

17. The structure of claim 2 wherein said intermediate layers comprise one or more buffer layers overlying said substrate in said first region and in said second region, and one or more buffer layers overlying said buffer layers in said first region, and said superconducting film overlies said seed layers in said first region, and said superconducting film overlies said buffer layers in said second region.

18. The structure of claim 2 wherein said intermediate layers comprise one or more first buffer layers overlying said substrate in said first region and in said second region, and one or more seed layers overlying said first buffer layers in said first region, and one or more second buffer layers overlying said seed layers in said first region and said first buffer layers in said second region, and said superconducting film overlies said second buffer layers in said first region and in said second region.

19. The structure of claim 2 wherein said intermediate layers comprise one or more seed layers overlying said substrate in said first region, and one or more seed layers overlying said substrate in said second region, and said superconducting film overlies said seed layers in said first region and said seed layers in said second region.

20. The structure of claim 19 wherein said substrate is yttria-stabilized zirconia having the crystallographic orientation denoted [100](001), said seed layer in said first region is yttrium barium copper oxide having the crystallographic orientation denoted [100](001), said seed layer in said second region is yttrium barium copper oxide having the crystallographic orientation dioxide having the crystallographic orientation denoted [100](001) in said first region, and having the crystallographic orientation denoted [110](001) in said second region.

21. The structure of claim 2 wherein said intermediate layers comprise one or more first buffer layers overlying said substrate in said first region, and one or more seed layers overlying said substrate in said second region, and one or more buffer layers overlying said seed layers in said first region and said seed layers in said second region, and said superconducting film overlies said buffer layers in said first region and in said second region.

22. The structure of claim 2 wherein said substrate is yttria-stabilized zirconia having the crystallographic orientation denoted [100](001), said seed layer in said first region is yttrium barium copper oxide having the crystallographic orientation denoted [100](001), said seed layer in said second region is yttrium barium copper oxide having the crystallographic orientation denoted [110](001), said buffer layer is strontium titanate having the crystallographic orientation denoted [100](001) in said first region and having the crystallographic orientation denoted [100](001) in said second region, and said superconducting layer is yttrium barium copper oxide having the crystallographic orientation denoted [100](001) in said first region, and having the crystallographic orientation denoted [110](001) in said second region.

23. The structure of claim 2 wherein said intermediate layers comprise one or more first buffer layers overlying said substrate in said first region and in said second region, and one or more seed layers overlying said substrate in said first region, and one or more seed layers overlying said substrate in said second region, and one or more buffer layers overlying said seed layers in said first region and said seed layers in said second region, and said superconducting film overlies said buffer layers in said first region and in said second region.

24. The structure of claim 2 wherein one or more of said intermediate layers overlies the layer immediately beneath it to an average thickness of one atomic monolayer or less.

25. The structure of claim 2 wherein the surface of said intermediate layers make an angle of less than 45° with the surface of the substrate.

26. The structure of claim 2 wherein the surface of said intermediate layers make an angle of less than 10° with the surface of the substrate.

27. The structure of claim 2 wherein said superconducting layer consists of an oxide material having a superconducting transition temperature higher than 15K.

28. The structure of claim 27 wherein said oxide material is chosen form a group consisting of mixed metal cuprates and mixed metal bismuthates.

29. The structure of claim 2 wherein said mismatch in orientation is greater than 5° and less than 90°.

30. The structure of claim 2 wherein said mismatch in orientation is equal to 45°.

31. The structure of claim 2 in which said border is selectively positioned to define said first and second regions.

32. The structure of claim 31 in which a plurality of adjacent first and second regions with borders therebetween are selectively positioned on said substrate.

33. The structure of claim 2 in which the superconducting film is a single crystalline layer.

34. The structure of claim 33 in which the single crystalline superconducting layer has a critical current density greater than $10^6$ amps/cm$^2$.

35. The structure of claim 34 in which the critical current density at said weak link is at least 10 times lower than that of the adjacent superconducting film.

36. The structure of claim 2 in which said weak link junction contains only one grain boundary per junction.

37. The structure of claim 2 in which the superconducting film adjacent said weak link junction is essentially planar.

38. The structure of claim 2 in which the surface of the substrate has a lattice mismatch sufficient to cause said seed layer to deposit with a crystal orientation rotated with respect to the surface adjacent said border.

39. A biepitaxial weak link junction comprising in combination, an uncut and unbonded substrate having a uniform planar surface;

a thin epitaxial seed layer selectively deposited on said surface to form a border, and a superconducting film epitaxially deposited over said seed layer border and adjacent surface in a first orientation over said seed layer and a second orientation over said surface adjacent to said border whereby a weak link junction is formed at said border.

* * * * *